(12) United States Patent
Scheible et al.

(10) Patent No.: US 11,658,016 B2
(45) Date of Patent: May 23, 2023

(54) SHIELD FOR A SUBSTRATE PROCESSING CHAMBER

(71) Applicant: Applied Materials, Inc., Santa Clara, CA (US)

(72) Inventors: Kathleen Scheible, San Francisco, CA (US); Michael Allen Flanigan, Dutch Flat, CA (US); Goichi Yoshidome, Emeryville, CA (US); Adolph Miller Allen, Oakland, CA (US); Cristopher Pavloff, San Francisco, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 163 days.

(21) Appl. No.: 16/409,757

(22) Filed: May 10, 2019

(65) Prior Publication Data

US 2019/0267220 A1     Aug. 29, 2019

Related U.S. Application Data

(62) Division of application No. 14/846,951, filed on Sep. 7, 2015, now Pat. No. 10,347,475, which is a division
(Continued)

(51) Int. Cl.
*H01J 37/34* (2006.01)
*C23C 14/34* (2006.01)
(Continued)

(52) U.S. Cl.
CPC ...... *H01J 37/3488* (2013.01); *C23C 14/3407* (2013.01); *C23C 14/50* (2013.01);
(Continued)

(58) Field of Classification Search
CPC .................................................. H01J 37/3441
See application file for complete search history.

(56) References Cited

U.S. PATENT DOCUMENTS

| 3,482,082 A | 12/1969 | Israeli |
| 3,679,460 A | 7/1972 | Reid |

(Continued)

FOREIGN PATENT DOCUMENTS

| CN | 1307143 A | 8/2001 |
| DE | 19719133 | 11/1998 |

(Continued)

OTHER PUBLICATIONS

Daviet et al. "Electrostatic Clamping Applied to Semiconductor Plasma Processing—I. Theoretical Modeling" J. Electrochem. Soc. 140(11):3245-3255 (Nov. 1993).
(Continued)

*Primary Examiner* — John J Brayton
(74) *Attorney, Agent, or Firm* — Ashok K. Janah; Janah & Associates, PC

(57) ABSTRACT

A shield encircles a sputtering target that faces a substrate support in a substrate processing chamber. The shield comprises an outer band having a diameter sized to encircle the sputtering target, the outer band having upper and bottom ends, and the upper end having a tapered surface extending radially outwardly and adjacent to the sputtering target. A base plate extends radially inward from the bottom end of the outer band. An inner band joined to the base plate at least partially surrounds a peripheral edge of a substrate support. The shield can also have a heat exchanger comprising a conduit with an inlet and outlet to flow heat exchange fluid therethrough.

20 Claims, 8 Drawing Sheets

Related U.S. Application Data of application No. 11/553,982, filed on Oct. 27, 2006, now Pat. No. 9,127,362.

(60) Provisional application No. 60/732,324, filed on Oct. 31, 2005.

(51) Int. Cl.
*C23C 14/50* (2006.01)
*H01L 21/687* (2006.01)

(52) U.S. Cl.
CPC .......... *H01J 37/34* (2013.01); *H01J 37/3441* (2013.01); *H01J 37/3447* (2013.01); *H01L 21/68735* (2013.01)

(56) References Cited

U.S. PATENT DOCUMENTS

| | | |
|---|---|---|
| 3,716,462 A | 2/1973 | Jensen |
| 3,725,220 A | 4/1973 | Kessler et al. |
| 3,748,253 A | 7/1973 | Provenzano |
| 4,374,722 A | 2/1983 | Zega |
| 4,384,918 A | 5/1983 | Abe |
| 4,412,133 A | 10/1983 | Eckes et al. |
| 4,415,421 A | 11/1983 | Sasanuma |
| 4,419,201 A | 12/1983 | Levinstein et al. |
| 4,430,173 A | 2/1984 | Boudot |
| 4,480,284 A | 10/1984 | Tojo et al. |
| 4,491,496 A | 1/1985 | Laporte et al. |
| 4,505,947 A | 3/1985 | Vukanovic et al. |
| 4,545,882 A | 10/1985 | Kelvey |
| 4,606,802 A | 8/1986 | Kobayashi et al. |
| 4,645,218 A | 2/1987 | Ooshio et al. |
| 4,665,463 A | 5/1987 | Ward et al. |
| 4,717,462 A | 1/1988 | Homma et al. |
| 4,832,781 A | 5/1989 | Mears |
| 4,872,250 A | 10/1989 | De Marco |
| 4,872,964 A | 10/1989 | Suzuki et al. |
| 4,905,886 A | 3/1990 | Kennedy et al. |
| 4,913,784 A | 4/1990 | Bogenschutz et al. |
| 4,924,436 A | 5/1990 | Strand |
| 4,983,269 A | 1/1991 | Wegmann |
| 4,995,958 A | 2/1991 | Anderson et al. |
| 5,041,194 A | 8/1991 | Mori et al. |
| 5,055,964 A | 10/1991 | Logan et al. |
| 5,064,511 A | 11/1991 | Gobbetti et al. |
| 5,104,834 A | 4/1992 | Watanabe et al. |
| 5,117,121 A | 5/1992 | Watanabe et al. |
| 5,151,845 A | 9/1992 | Watanabe et al. |
| 5,166,758 A | 11/1992 | Ovshinsky et al. |
| 5,166,856 A | 11/1992 | Liporace et al. |
| 5,191,506 A | 3/1993 | Logan et al. |
| 5,215,639 A | 6/1993 | Boys |
| 5,258,047 A | 11/1993 | Tokisue et al. |
| 5,270,266 A | 12/1993 | Hirano et al. |
| 5,275,683 A | 1/1994 | Arami et al. |
| 5,280,156 A | 1/1994 | Niori et al. |
| 5,314,597 A | 5/1994 | Harra |
| 5,315,473 A | 5/1994 | Collins et al. |
| 5,324,053 A | 6/1994 | Kubota et al. |
| 5,325,261 A | 6/1994 | Horwitz |
| 5,342,496 A | 8/1994 | Stellrecht |
| 5,350,479 A | 9/1994 | Collins et al. |
| 5,356,723 A | 10/1994 | Kimoto et al. |
| 5,382,469 A | 1/1995 | Kubota et al. |
| 5,391,275 A | 2/1995 | Mintz |
| 5,401,319 A | 3/1995 | Banholzer et al. |
| 5,407,551 A | 4/1995 | Sieck et al. |
| 5,409,590 A | 4/1995 | Hurwitt et al. |
| 5,429,711 A | 7/1995 | Watanabe et al. |
| 5,433,835 A | 7/1995 | Demaray et al. |
| 5,435,965 A | 7/1995 | Mashima et al. |
| 5,458,759 A | 10/1995 | Hosokawa et al. |
| 5,460,694 A | 10/1995 | Schapira et al. |
| 5,463,526 A | 10/1995 | Mundt |
| 5,474,649 A | 12/1995 | Kava et al. |
| 5,487,822 A | 1/1996 | Demaray et al. |
| 5,487,823 A | 1/1996 | Sawada et al. |
| 5,490,913 A | 2/1996 | Schertler et al. |
| 5,512,078 A | 4/1996 | Griffin |
| 5,518,593 A * | 5/1996 | Hosokawa .......... C23C 14/3407 118/641 |
| 5,538,603 A | 7/1996 | Guo |
| 5,542,559 A | 8/1996 | Kawakami et al. |
| 5,549,802 A | 8/1996 | Guo |
| 5,565,071 A | 10/1996 | Demaray et al. |
| 5,587,039 A | 12/1996 | Salimian et al. |
| 5,595,337 A | 1/1997 | Demaray et al. |
| 5,595,938 A | 1/1997 | Miyazaki |
| 5,628,889 A | 5/1997 | Gardell et al. |
| 5,643,422 A | 7/1997 | Yamada |
| 5,684,669 A | 11/1997 | Collins et al. |
| 5,685,914 A | 11/1997 | Hills et al. |
| 5,685,959 A | 11/1997 | Bourez et al. |
| 5,690,795 A * | 11/1997 | Rosenstein .......... C23C 14/564 118/721 |
| 5,693,203 A | 12/1997 | Ohhashi et al. |
| 5,695,825 A | 12/1997 | Scruggs |
| 5,700,179 A | 12/1997 | Hasegawa et al. |
| 5,714,768 A | 2/1998 | Ovshinsky et al. |
| 5,720,818 A | 2/1998 | Donde et al. |
| 5,762,748 A | 6/1998 | Banholzer et al. |
| 5,772,858 A | 6/1998 | Tepman |
| 5,789,717 A | 8/1998 | Imaizumi et al. |
| 5,792,562 A | 8/1998 | Collins et al. |
| 5,798,029 A | 8/1998 | Morita |
| 5,799,860 A | 9/1998 | Demaray et al. |
| 5,800,725 A | 9/1998 | Kato et al. |
| 5,803,342 A | 9/1998 | Kardokus |
| 5,808,270 A | 9/1998 | Marantz et al. |
| 5,812,362 A | 9/1998 | Ravi |
| 5,821,166 A | 10/1998 | Hajime et al. |
| 5,824,197 A | 10/1998 | Tanaka |
| 5,830,327 A | 11/1998 | Kolnekow |
| 5,858,100 A | 1/1999 | Maeda et al. |
| 5,876,573 A | 3/1999 | Moslehi et al. |
| 5,879,523 A | 3/1999 | Wang et al. |
| 5,879,524 A | 3/1999 | Hurwitt et al. |
| 5,886,863 A | 3/1999 | Nagasaki et al. |
| 5,887,481 A | 3/1999 | Leroy et al. |
| 5,903,428 A | 5/1999 | Grimard et al. |
| 5,910,338 A | 6/1999 | Donde et al. |
| 5,914,018 A | 6/1999 | Fu et al. |
| 5,916,378 A | 6/1999 | Bailey et al. |
| 5,916,454 A | 6/1999 | Richardson et al. |
| 5,919,345 A | 7/1999 | Tepman |
| 5,920,764 A | 7/1999 | Hanson |
| 5,942,041 A | 8/1999 | Lo et al. |
| 5,942,089 A | 8/1999 | Sproul et al. |
| 5,942,445 A | 8/1999 | Kato et al. |
| 5,948,288 A | 9/1999 | Treves et al. |
| 5,951,374 A | 9/1999 | Kato et al. |
| 5,953,827 A | 9/1999 | Or et al. |
| 5,963,778 A | 10/1999 | Stellrecht |
| 5,976,327 A | 11/1999 | Tanaka |
| 6,001,426 A | 12/1999 | Witherspoon et al. |
| 6,010,583 A | 1/2000 | Annavarapu et al. |
| 6,015,465 A | 1/2000 | Kholodenko et al. |
| 6,024,852 A | 2/2000 | Tamura et al. |
| 6,026,666 A | 2/2000 | Zimmermann et al. |
| 6,040,545 A | 3/2000 | Taki et al. |
| 6,042,706 A | 3/2000 | Fu |
| 6,051,114 A | 4/2000 | Yao et al. |
| 6,051,122 A | 4/2000 | Flanigan |
| 6,059,945 A | 5/2000 | Fu et al. |
| 6,071,323 A | 6/2000 | Kawaguchi |
| 6,071,389 A | 6/2000 | Zhang |
| 6,073,830 A | 6/2000 | Hunt et al. |
| 6,086,735 A | 7/2000 | Gilman et al. |
| 6,108,189 A | 8/2000 | Weldon et al. |
| 6,120,640 A | 9/2000 | Shih et al. |
| 6,139,701 A | 10/2000 | Pavate et al. |
| 6,143,432 A | 11/2000 | de Rochemont et al. |
| 6,146,509 A | 11/2000 | Aragon |

(56) References Cited

U.S. PATENT DOCUMENTS

| | | | |
|---|---|---|---|
| 6,149,776 A * | 11/2000 | Tang | C23C 14/3407 204/192.12 |
| 6,149,784 A * | 11/2000 | Su | C23C 14/3407 204/192.12 |
| 6,150,762 A | 11/2000 | Kim et al. | |
| 6,152,071 A | 11/2000 | Akiyama et al. | |
| 6,159,299 A | 12/2000 | Koai et al. | |
| 6,162,297 A | 12/2000 | Mintz et al. | |
| 6,170,429 B1 | 1/2001 | Schoepp et al. | |
| 6,179,973 B1 | 1/2001 | Lai et al. | |
| 6,183,614 B1 | 2/2001 | Fu | |
| 6,183,686 B1 | 2/2001 | Bardus et al. | |
| 6,187,682 B1 | 2/2001 | Denning et al. | |
| 6,190,513 B1 * | 2/2001 | Forster | H01J 37/321 204/192.12 |
| 6,190,516 B1 | 2/2001 | Xiong et al. | |
| 6,198,067 B1 | 3/2001 | Ikeda et al. | |
| 6,199,259 B1 | 3/2001 | Demaray et al. | |
| 6,221,217 B1 | 4/2001 | Moslehi et al. | |
| 6,227,435 B1 | 5/2001 | Lazarz et al. | |
| 6,231,725 B1 | 5/2001 | Nulman et al. | |
| 6,238,528 B1 | 5/2001 | Xu et al. | |
| 6,244,121 B1 | 6/2001 | Hunter | |
| 6,248,667 B1 | 6/2001 | Kim et al. | |
| 6,250,251 B1 | 6/2001 | Akiyama et al. | |
| 6,251,242 B1 | 6/2001 | Fu et al. | |
| 6,267,851 B1 | 7/2001 | Hosokawa | |
| 6,269,670 B2 | 8/2001 | Koestermeier | |
| 6,274,008 B1 | 8/2001 | Gopalraja et al. | |
| 6,276,997 B1 | 8/2001 | Li | |
| 6,277,249 B1 | 8/2001 | Gopalraja et al. | |
| 6,277,263 B1 | 8/2001 | Chen | |
| 6,283,357 B1 | 9/2001 | Kulkarni et al. | |
| 6,284,093 B1 | 9/2001 | Ke et al. | |
| 6,284,628 B1 | 9/2001 | Kuwahara et al. | |
| 6,287,437 B1 | 9/2001 | Pandhumsoporn et al. | |
| 6,299,740 B1 | 10/2001 | Hieronymi et al. | |
| 6,306,226 B1 | 10/2001 | Lino et al. | |
| 6,306,498 B1 | 10/2001 | Yuuki et al. | |
| 6,309,556 B1 | 10/2001 | Joyce et al. | |
| 6,337,151 B1 | 1/2002 | Uzoh et al. | |
| 6,337,453 B1 | 1/2002 | Miller et al. | |
| 6,338,781 B1 | 1/2002 | Sichmann et al. | |
| 6,338,906 B1 | 1/2002 | Ritland et al. | |
| 6,340,415 B1 | 1/2002 | Raajimakers et al. | |
| 6,344,114 B1 | 2/2002 | Sichmann et al. | |
| 6,346,177 B2 | 2/2002 | Leiphart | |
| 6,365,010 B1 | 4/2002 | Hollars | |
| 6,372,609 B1 | 4/2002 | Aga | |
| 6,387,809 B2 | 5/2002 | Toyama | |
| 6,406,599 B1 | 6/2002 | Subramani et al. | |
| 6,409,965 B1 | 6/2002 | Nagata et al. | |
| 6,413,382 B1 | 7/2002 | Wang et al. | |
| 6,413,387 B1 | 7/2002 | Shi et al. | |
| 6,413,858 B1 | 7/2002 | Chopra | |
| 6,416,634 B1 | 7/2002 | Mostovoy et al. | |
| 6,419,806 B1 | 7/2002 | Holcomb et al. | |
| 6,423,175 B1 | 7/2002 | Huang et al. | |
| 6,432,203 B1 * | 8/2002 | Black | C23C 14/564 118/504 |
| 6,436,251 B2 | 8/2002 | Gopalraja et al. | |
| 6,437,383 B1 | 8/2002 | Xu | |
| 6,440,221 B2 | 8/2002 | Shamouilian et al. | |
| 6,444,104 B2 | 9/2002 | Gopalraja et al. | |
| 6,451,177 B1 | 9/2002 | Gopalraja et al. | |
| 6,454,919 B1 | 9/2002 | Sundarrahan et al. | |
| 6,464,794 B1 | 10/2002 | Park et al. | |
| 6,464,889 B1 | 10/2002 | Lee et al. | |
| 6,475,336 B1 | 11/2002 | Hubacek | |
| 6,475,854 B2 | 11/2002 | Narwankar et al. | |
| 6,482,302 B1 | 11/2002 | Li et al. | |
| 6,487,910 B1 | 12/2002 | Leybovich | |
| 6,491,801 B1 | 12/2002 | Gung | |
| 6,494,098 B1 | 12/2002 | Leybovich | |
| 6,495,009 B1 | 12/2002 | Gung | |
| 6,500,321 B1 | 12/2002 | Ashtiani et al. | |
| 6,506,312 B1 | 1/2003 | Bottomfield | |
| 6,507,061 B1 | 1/2003 | Hudgens et al. | |
| 6,518,086 B2 | 2/2003 | Beck et al. | |
| 6,537,428 B1 | 3/2003 | Xiong et al. | |
| 6,555,471 B2 | 4/2003 | Sandhu et al. | |
| 6,558,505 B2 | 5/2003 | Suzuki et al. | |
| 6,576,909 B2 | 6/2003 | Donaldson et al. | |
| 6,579,431 B1 | 6/2003 | Bolcavage et al. | |
| 6,599,405 B2 | 7/2003 | Hunt et al. | |
| 6,610,959 B2 | 8/2003 | Carlson et al. | |
| 6,613,959 B1 | 9/2003 | Sheen et al. | |
| 6,619,537 B1 | 9/2003 | Zhang et al. | |
| 6,620,296 B2 | 9/2003 | Gogh et al. | |
| 6,620,736 B2 | 9/2003 | Drewery | |
| 6,623,597 B1 | 9/2003 | Han et al. | |
| 6,623,610 B1 | 9/2003 | Onishi | |
| 6,627,050 B2 | 9/2003 | Miller et al. | |
| 6,635,219 B2 | 10/2003 | Wen et al. | |
| 6,652,668 B1 | 11/2003 | Perry et al. | |
| 6,660,135 B2 | 12/2003 | Yu et al. | |
| 6,677,254 B2 | 1/2004 | Narwankar et al. | |
| 6,699,375 B1 | 3/2004 | Crocker | |
| 6,708,870 B2 | 3/2004 | Koenigsmann et al. | |
| 6,709,557 B1 | 3/2004 | Kailasam et al. | |
| 6,716,321 B2 | 4/2004 | Gilmore et al. | |
| 6,730,196 B2 | 5/2004 | Wang et al. | |
| 6,739,196 B2 | 5/2004 | Leybovich | |
| 6,743,340 B2 | 6/2004 | Fu | |
| 6,743,342 B2 | 6/2004 | Wang | |
| 6,749,103 B1 | 6/2004 | Ivanov et al. | |
| 6,750,156 B2 | 6/2004 | Le et al. | |
| 6,759,267 B2 | 7/2004 | Chen | |
| 6,776,879 B2 | 8/2004 | Yamamoto et al. | |
| 6,777,045 B2 | 8/2004 | Lin et al. | |
| 6,797,362 B2 | 9/2004 | Parfeniuk et al. | |
| 6,824,652 B2 | 11/2004 | Park | |
| 6,840,427 B2 | 1/2005 | Ivanov | |
| 6,841,050 B2 | 1/2005 | Hong et al. | |
| 6,848,608 B2 | 2/2005 | Wickersham | |
| 6,852,202 B2 | 2/2005 | Miller et al. | |
| 6,858,116 B2 | 2/2005 | Okabe et al. | |
| 6,858,277 B1 | 2/2005 | Yamada et al. | |
| 6,872,284 B2 | 3/2005 | Ivanov et al. | |
| 6,887,356 B2 | 5/2005 | Ford et al. | |
| 6,916,407 B2 | 7/2005 | Vosser et al. | |
| 6,933,025 B2 | 8/2005 | Lin et al. | |
| 6,946,408 B2 | 9/2005 | Le et al. | |
| 6,955,852 B2 | 10/2005 | Ivanov | |
| 6,992,261 B2 | 1/2006 | Kachalov et al. | |
| 7,026,009 B2 | 4/2006 | Lin et al. | |
| 7,037,762 B2 | 5/2006 | Joo et al. | |
| 7,063,773 B2 | 6/2006 | Ivanov et al. | |
| 7,115,193 B2 | 10/2006 | Takahashi | |
| 7,115,927 B2 | 10/2006 | Hideki et al. | |
| 7,131,883 B2 | 11/2006 | Park et al. | |
| 7,146,703 B2 | 12/2006 | Ivanov | |
| 7,175,802 B2 | 2/2007 | Sandlin et al. | |
| 7,297,247 B2 | 11/2007 | Subramani et al. | |
| 7,316,763 B2 | 1/2008 | Hosokawa et al. | |
| 7,331,250 B2 | 2/2008 | Hunter | |
| 7,476,289 B2 | 1/2009 | White | |
| 7,504,008 B2 | 3/2009 | Doan et al. | |
| 7,550,055 B2 | 6/2009 | Le et al. | |
| 7,550,066 B2 | 6/2009 | Tepman | |
| 7,588,668 B2 | 9/2009 | Ye et al. | |
| 7,644,745 B2 | 1/2010 | Le et al. | |
| 9,127,362 B2 | 9/2015 | Scheible | |
| 2001/0001367 A1 | 5/2001 | Koestermeier | |
| 2001/0007302 A1 * | 7/2001 | Hong | H01J 37/3408 204/192.12 |
| 2001/0030172 A1 | 10/2001 | Takahashi et al. | |
| 2001/0033706 A1 | 10/2001 | Shimomura et al. | |
| 2001/0035237 A1 | 11/2001 | Nagano et al. | |
| 2001/0035238 A1 | 11/2001 | Nagano et al. | |
| 2001/0045353 A1 | 11/2001 | Hieronymi et al. | |
| 2002/0014289 A1 | 2/2002 | Nagano et al. | |
| 2002/0029745 A1 | 3/2002 | Nnagaiwa et al. | |
| 2002/0033330 A1 | 3/2002 | Demaray et al. | |

(56) References Cited

U.S. PATENT DOCUMENTS

| | | |
|---|---|---|
| 2002/0075631 A1 | 6/2002 | Singh et al. |
| 2002/0076490 A1 | 6/2002 | Chiang et al. |
| 2002/0079217 A1 | 6/2002 | Buehler |
| 2002/0081804 A1 | 6/2002 | Gill et al. |
| 2002/0083571 A1 | 7/2002 | Lee et al. |
| 2002/0086118 A1 | 7/2002 | Chang et al. |
| 2002/0090464 A1 | 7/2002 | Jiang et al. |
| 2002/0100680 A1 | 8/2002 | Yamamoto et al. |
| 2002/0112955 A1 | 8/2002 | Aimone et al. |
| 2002/0121436 A1 | 9/2002 | Gogh et al. |
| 2002/0153130 A1* | 10/2002 | Okamoto ............ C23C 14/3407 165/170 |
| 2003/0026917 A1 | 2/2003 | Lin et al. |
| 2003/0035906 A1 | 2/2003 | Memarian et al. |
| 2003/0047464 A1 | 3/2003 | Sun et al. |
| 2003/0102207 A1 | 6/2003 | Wu et al. |
| 2003/0116276 A1 | 6/2003 | Weldon et al. |
| 2003/0118731 A1 | 6/2003 | He et al. |
| 2003/0124748 A1 | 7/2003 | Summerfelt et al. |
| 2003/0127319 A1 | 7/2003 | Demaray et al. |
| 2003/0136520 A1 | 7/2003 | Yudovsky |
| 2003/0168168 A1 | 9/2003 | Liu et al. |
| 2003/0173526 A1 | 9/2003 | Popiolkowski et al. |
| 2003/0175142 A1 | 9/2003 | Milonopoulou et al. |
| 2003/0185965 A1 | 10/2003 | Lin et al. |
| 2003/0218054 A1 | 11/2003 | Koenigsmann et al. |
| 2004/0016635 A1 | 1/2004 | Ford et al. |
| 2004/0020769 A1 | 2/2004 | Ivanov et al. |
| 2004/0035698 A1 | 2/2004 | Ivanov et al. |
| 2004/0055880 A1* | 3/2004 | Gung ............... H01J 37/3411 204/298.06 |
| 2004/0056070 A1 | 3/2004 | Ivanov |
| 2004/0056211 A1 | 3/2004 | Popiolkowski et al. |
| 2004/0079634 A1 | 4/2004 | Wickersham et al. |
| 2004/0089542 A1 | 5/2004 | Liu et al. |
| 2004/0099285 A1 | 5/2004 | Wang et al. |
| 2004/0113364 A1 | 6/2004 | Ivanov |
| 2004/0115945 A1 | 6/2004 | Lowrey et al. |
| 2004/0144638 A1 | 7/2004 | Jaso |
| 2004/0165422 A1 | 8/2004 | Hideki et al. |
| 2004/0222088 A1 | 11/2004 | Subramani et al. |
| 2004/0256226 A1 | 12/2004 | Wickersham |
| 2004/0261946 A1 | 12/2004 | Endoh et al. |
| 2005/0002227 A1 | 1/2005 | Hideki et al. |
| 2005/0011749 A1 | 1/2005 | Kachalov et al. |
| 2005/0029094 A1 | 2/2005 | Watanabe et al. |
| 2005/0029502 A1 | 2/2005 | Hudgens |
| 2005/0061857 A1 | 3/2005 | Hunt et al. |
| 2005/0067469 A1 | 3/2005 | Facey et al. |
| 2005/0072668 A1 | 4/2005 | Kennedy et al. |
| 2005/0089699 A1 | 4/2005 | Lin et al. |
| 2005/0092604 A1 | 5/2005 | Ivanov |
| 2005/0115045 A1 | 6/2005 | Koenigsmann et al. |
| 2005/0147150 A1 | 7/2005 | Wickersham et al. |
| 2005/0147742 A1* | 7/2005 | Kieshock ........... H01J 37/32522 428/685 |
| 2005/0161322 A1 | 7/2005 | Smathers |
| 2005/0178653 A1 | 8/2005 | Fisher |
| 2005/0211548 A1 | 9/2005 | Gung et al. |
| 2005/0282358 A1 | 12/2005 | Di Ciaccio et al. |
| 2006/0005767 A1 | 1/2006 | Tsai et al. |
| 2006/0021870 A1 | 2/2006 | Tsai et al. |
| 2006/0070876 A1 | 4/2006 | Wu et al. |
| 2006/0081459 A1 | 4/2006 | Tsai et al. |
| 2006/0099126 A1 | 5/2006 | Hosono et al. |
| 2006/0105182 A1 | 5/2006 | Brueckner et al. |
| 2006/0108217 A1 | 5/2006 | Krempel-Hesse et al. |
| 2006/0188742 A1 | 8/2006 | West et al. |
| 2006/0266639 A1 | 11/2006 | Le et al. |
| 2006/0283703 A1 | 12/2006 | Le et al. |
| 2006/0289305 A1 | 12/2006 | White |
| 2007/0056845 A1 | 3/2007 | Ye et al. |
| 2007/0102286 A1 | 5/2007 | Schieble et al. |
| 2007/0125646 A1 | 6/2007 | Young et al. |
| 2007/0170052 A1 | 7/2007 | Ritchie et al. |
| 2007/0173059 A1 | 7/2007 | Young et al. |
| 2007/0215463 A1 | 9/2007 | Parkhe et al. |
| 2007/0246346 A1 | 10/2007 | Subramani et al. |
| 2008/0006523 A1* | 1/2008 | Hosokawa ........ H01J 37/32623 204/192.1 |
| 2008/0178801 A1 | 7/2008 | Pavloff et al. |
| 2008/0257263 A1 | 10/2008 | Pavloff et al. |
| 2008/0308416 A1 | 12/2008 | Allen et al. |
| 2009/0090620 A1 | 4/2009 | Pavloff |
| 2009/0107834 A1 | 4/2009 | Ye et al. |
| 2009/0114528 A1 | 5/2009 | Lindenberg et al. |
| 2009/0178919 A1 | 7/2009 | Lopp et al. |
| 2009/0272641 A1 | 11/2009 | Mueller et al. |

FOREIGN PATENT DOCUMENTS

| | | |
|---|---|---|
| EP | 0239349 | 9/1987 |
| EP | 0439000 | 7/1991 |
| EP | 0601788 | 6/1994 |
| EP | 0635869 | 1/1995 |
| EP | 0791956 | 8/1997 |
| EP | 0818803 A | 1/1998 |
| EP | 0838838 | 4/1998 |
| EP | 1094496 A | 4/2001 |
| EP | 1350861 | 10/2003 |
| GB | 2049737 | 12/1980 |
| GB | 2155495 | 9/1985 |
| JP | 54-162969 | 12/1979 |
| JP | 58-147558 | 9/1983 |
| JP | 63290270 | 11/1988 |
| JP | 1283367 | 11/1989 |
| JP | 02-027748 | 1/1990 |
| JP | 04-367247 | 12/1992 |
| JP | 06-232243 | 8/1994 |
| JP | 07-197272 | 8/1995 |
| JP | 07224377 | 8/1995 |
| JP | 09-017850 | 1/1997 |
| JP | 09111452 | 4/1997 |
| JP | 11-106904 | 4/1999 |
| JP | 11-137440 | 5/1999 |
| JP | 2000265265 | 9/2000 |
| JP | 2002-060935 | 2/2002 |
| JP | 2002-69695 | 3/2002 |
| JP | 2002-69696 | 3/2002 |
| JP | 2004-132725 | 4/2004 |
| WO | WO-99/17336 A1 | 4/1999 |
| WO | WO-00/26430 A1 | 5/2000 |
| WO | WO-01/39250 | 5/2001 |
| WO | WO 2002/093624 | 11/2002 |
| WO | WO-03062491 | 7/2003 |
| WO | WO-2004-001094 | 12/2003 |
| WO | WO-2004/010494 A2 | 1/2004 |
| WO | WO-2004-02979 | 3/2004 |
| WO | WO-2004/033748 | 4/2004 |
| WO | WO 2005/071137 | 8/2005 |
| WO | WO-2006/078709 | 7/2006 |
| WO | WO-07037796 | 4/2007 |
| WO | WO 2008/079722 | 7/2008 |
| WO | WO-2008/156794 | 3/2009 |

OTHER PUBLICATIONS

Daviet et al. "Electrostatic Clamping Applied to Semiconductor Plasma Processing—II. Experimental Results" J. Electrochem. Soc. 140(11):3256-3261 (Nov. 1993).

Nakasuji et al. "Low Voltage and High Speed Operating Electrostatic Wafer Chuck" J. Vac. Sci. Technol. A 10(6):3573-3578 (Nov./Dec. 1 992).

Rosenberg RW "Increasing PVD Tool Uptime and Particle Control with Twin-Wire-Arc Spray Coatings" Mar. 2001 p. 103-105108 11 vol. 19 No. 3 Cannon Comm. Santa Monica CA.

Tucker Jr. Robert C. "Plasma and Detonation Gun Deposition Techniques and Coating Properties" Union Carbide Corp. Coatings Service Dept. Indianapolis IN pp. 454-489.

Watanabe et al. "Effect of Additives on the Electrostatic Force of Alumina Electrostatic Chucks" J. of the Ceramic Soc. of Jpn. 100(1):1-6 (1992).

(56) References Cited

OTHER PUBLICATIONS

Watanabe et al. "Electrostatic Force and Absorption Current of Alumina Electrostatic Chucks" Jpn. J. Appl. Phy. 31(pt1 No. 7):2145-2150 (1992).
Watanabe et al. "Relationship Between Electrical Resistivity and Electrostatic Force of Alumina Electrostatic Chuck" Jpn. J. Appl. Phy. 32(Pt1 No. 2):864-871 (1993).
Watanabe et al. "Resistivity and Microstructure of Alumina Ceramics Added with TiO2 Fired in Reducing Atmosphere" J. of the Ceramic Doc. of Jpn. Int. Ed. 101-1076-1083.
Wright et al. "Low Temperature Etch Chuck: Modeling and Experimental Results of Heat Transfer and Wafer Temperature" J. Vac. Sci. Technol. A 10(4):1065-1070(Jul./Aug. 1992.).
Non-Final Office Action from U.S. Appl. No. 10/981,261 dated Mar. 6, 2009.
Final Office Action in U.S. Appl. No. 10/981,261 dated Dec. 16, 2008.
Non-Final Office Action in U.S. Appl. No. 10/981,261 dated Jun. 4, 2008.
Final Office Action in U.S. Appl. No. 10/981,261 dated Oct. 30, 2007.
Non-Final Office Action in U.S. Appl. No. 10/981,261 dated May 17, 2007.
Office Action dated Dec. 15, 2008 in U.S. Appl. No. 11/444,175 entitled "Ring assembly for substrate processing chamber".
Final Office Action dated Jul. 20, 2009 in U.S. Appl. No. 11/444,175 entitled "Ring assembly for substrate processing chamber".
Tiller et al., "Ring Assembly for Substrate Processing Chamber," U.S. Appl. No. 12/623,324, filed Nov. 20, 2009.
Advisory Action in U.S. Appl. No. 11/553,981, dated Mar. 15, 2012.
Advisory Action in U.S. Appl. No. 11/553,981, dated Jun. 14, 2011.
Appeal Board Decision in U.S. Appl. No. 11/553,981, Feb. 3, 2012.
Examiner's Answer in U.S. Appl. No. 11/553,981, dated Oct. 25, 2012.
Final Action in U.S. Appl. No. 11/553,981, dated Jan. 13, 2012.
Final Action in U.S. Appl. No. 11/553,981, dated Jan. 5, 2011.
Notice of Allowance in U.S. Appl. No. 11/553,981, dated Apr. 15, 2015.
Restriction Requirement in U.S. Appl. No. 11/553,981, dated Mar. 30, 2010.
Office Action in U.S. Appl. No. 11/553,981, dated Jun. 22, 2010.
Advisory Action in U.S. Appl. No. 11/553,981, dated Jul. 7, 2011.
Office Action in U.S. Appl. No. 14/846,95, dated Apr. 26, 2018.
Final Office Action in U.S. Appl. No. 14/846,95, dated Oct. 4, 2018.
Advisory Action in U.S. Appl. No. 14/846,95, dated Jan. 4, 2019.
Notice of Allowance in U.S. Appl. No. 14/846,95, dated Feb. 14, 2019.

* cited by examiner

SHIELD FOR A SUBSTRATE PROCESSING CHAMBER

CROSS-REFERENCE

This application claims priority from U.S. Pat. No. 10,347,475, U.S. patent application Ser. No. 14/846,951, filed on Sep. 7, 2015, which claims priority from U.S. Pat. No. 9,127,362, U.S. patent application Ser. No. 11/553,982, filed on Oct. 27, 2006, which claims priority from U.S. Provisional Patent Application No. 60/732,324, filed on Oct. 31, 2005, all of which are incorporated herein by reference in their entireties.

BACKGROUND

Embodiments of the present invention relate to holding assemblies, shields, process kits and targets for a substrate processing chamber.

In the processing of substrates, such as semiconductor wafers and displays, a substrate is placed in a process chamber and processing conditions are set in the chamber to deposit or etch material on the substrate. A typical process chamber comprises chamber components that include an enclosure wall that encloses a process zone, a gas supply to provide a gas in the chamber, a gas energizer to energize the process gas to process the substrate, a substrate support to hold the substrate, and a gas exhaust to remove spent gas and maintain a gas pressure in the chamber. Such chambers can include, for example, CVD, PVD and etching chambers. In a PVD chamber, a target is sputtered to cause sputtered target material to deposit on a substrate facing the target. In the sputtering process, an inert or reactive gas is supplied into the chamber, the target is typically electrically biased, and the substrate maintained at an electrical floating potential, to generate a plasma in the chamber which causes sputtering of the target.

The PVD chamber can include a process kit comprising chamber components which are positioned the substrate support to reduce the formation of PVD deposits on the interior chamber walls or other regions. A typical PVD chamber process kit can include, for example, deposition, cover, and/or shadow rings, all of which are located about the periphery of the substrate. Various configurations of rings are arranged to receive sputtering deposits, which would otherwise accumulate on the side surfaces of the support or on the exposed backside surfaces of the substrate. The process kit can also include chamber shields and liners which protect the sidewalls of the chamber by serving as a receiving surface to receive PVD sputtering deposits which would otherwise deposit on the sidewalls of the chamber. The process kit components also reduce the accumulation of sputtered deposits on these surfaces, which would otherwise eventually flake off to form contaminant particles that deposit on the substrate. The kit components also reduce erosion of the internal chamber structures by the energized plasma. They can also be designed to be easily removable for cleaning of accumulated deposits. After processing of a batch of substrates, for example, 1000 substrates, the process kit components are typically removed and cleaned with an acidic solution comprising for example, HF and $HNO_3$, to remove the sputtered deposits accumulated on the kit components during the substrate process cycles.

It is desirable to have a process kit comprising components that are shaped and arranged in relationship to one another to reduce the amounts of sputtered deposits formed on the internal walls of the chamber. Reducing the accumulated deposits allows a greater number of substrates to be sequentially processed in the chamber without requiring shutdown or dismantling of the chamber for cleaning. Each time the chamber requires cleaning, the resultant downtime of the chamber increases the cost of processing the substrate. Thus it is desirable to maximize the amount of time the chamber can be operated to sputter material onto the substrate without shutting down the chamber to clean its internal surfaces.

Furthermore, in certain PVD processes, such as for example, aluminum PVD processes, the sputtered aluminum deposits accumulate in the gaps between the various deposition, cover, and other rings around the periphery of the substrate, and also form on the backside of the substrate. The accumulated sputtered deposits cause the substrate to stick to the deposition ring causing substrate damage when the substrate is attempted to be removed from the support. It is desirable to have rings which can reduce deposition on the backside of the substrate and side surface of the support without accumulating deposits on portions of the rings that cause the substrate to stick to the rings. It is also desirable to prevent a partially stuck deposition ring to rise with the substrate when the substrate is lifted from the support to reduce damage to the substrate and/or deposition ring.

Another problem arises when the liners and shields surrounding the substrate heat up with exposure to the sputtering plasma in the chamber. Typically, the shields and liners do not exchange a sufficient amount of heat with their surrounding chamber components in the low pressure environment within the chamber to lower the temperature of these components to acceptable levels. Excessive heating of these components is detrimental because thermal expansion of the components causes thermal stresses that result in peeling or spalling of the sputtered deposits formed on the shields and liners after a process cycle is completed. Thus, it is desirable to maintain the shields and liners at reduced or low temperatures during processing of the substrate.

SUMMARY

A shield encircles a sputtering target that faces a substrate support in a substrate processing chamber. The shield comprises an outer band having a diameter sized to encircle the sputtering target, the outer band having upper and bottom ends, and the upper end having a tapered surface extending radially outwardly and adjacent to the sputtering target. A base plate extends radially inward from the bottom end of the outer band. An inner band joined to the base plate at least partially surrounds a peripheral edge of a substrate support.

A heat exchanger can be used for cooling the shield. The heat exchanger comprises a plate comprising an aperture shaped and sized to fit around the shield, and a polygon conduit in the plate, the polygon conduit comprising a plurality of legs that are interconnected in a polygonal pattern around the aperture, and the polygonal conduit comprising an inlet and outlet to flow heat exchange fluid therethrough.

A sputtering target is capable of fitting within a shield and resting on an isolator in a substrate processing chamber. The sputtering target comprises a sputtering plate composed of a sputtering material to be sputtered onto the substrate, the sputtering plate comprising a sloped edge. A backing plate is provided for supporting the sputtering plate, the backing plate comprising a peripheral ledge which extends beyond the sloped edge of the sputtering plate, the peripheral ledge comprising a footing which rests on the isolator in the chamber, and an inner bump which is shaped and sized to reduce deposition of sputtering deposits on the isolator and shield.

DRAWINGS

These features, aspects and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

DESCRIPTION

Figure 1:
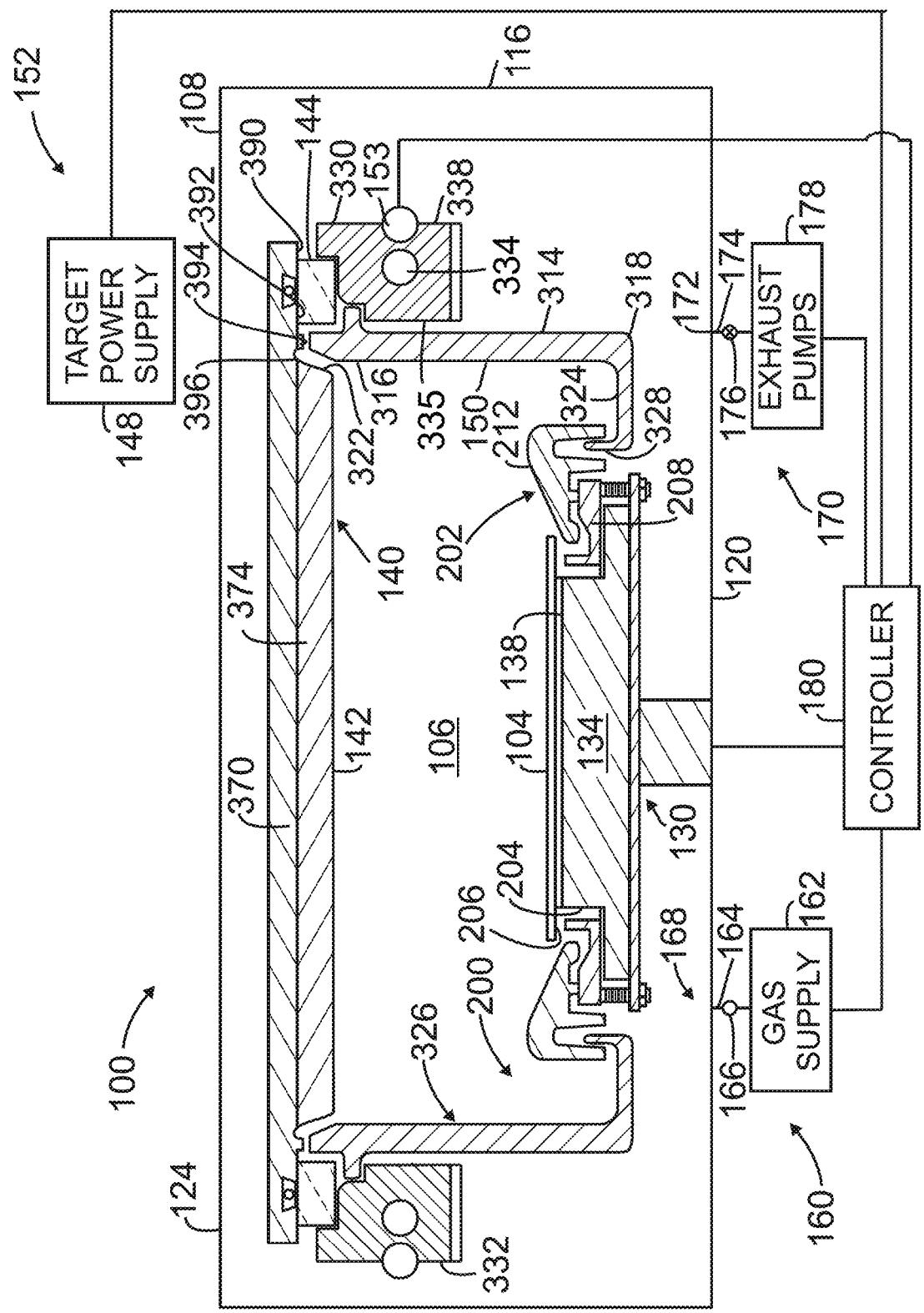
FIG. 1 is a schematic sectional side view of a substrate processing chamber having an embodiment of the process kit.

An example of a suitable process chamber 100 capable of processing a substrate 104 is shown in FIG. 1. The chamber 100 comprises enclosure walls 108 that enclose a process zone 106, the walls 108 including sidewalls 116, a bottom wall 120, and a ceiling 124. The chamber 100 can be a part of a multi-chamber platform (not shown) having a cluster of interconnected chambers connected by a robot arm mechanism that transfers substrates 104 between the chambers 106. In the version shown, the process chamber 100 comprises a sputter deposition chamber, also called a physical vapor deposition or PVD chamber, which is capable of sputter depositing material on a substrate 104, such as one or more of tantalum, tantalum nitride, titanium, titanium nitride, copper, tungsten, tungsten nitride and aluminum.

The chamber 100 comprises a substrate support 130 to support the substrate 104 which comprises a pedestal 134. The pedestal 134 has a substrate receiving surface 138 that receives and supports the substrate 104 during processing, and may include an electrostatic chuck or a heater, such as an electrical resistance heater or heat exchanger (not shown).

In operation, a substrate 104 is introduced into the chamber 100 through a substrate loading inlet (not shown) in the sidewall 116 of the chamber 100 and placed on the substrate support 130. The support 130 can be lifted or lowered by support lift bellows and/or a lift finger assembly (not shown) can be used to lift and lower the substrate onto the support 130 during placement of a substrate 104 on the support 130. The pedestal 134 can be maintained at an electrically floating potential or grounded during plasma operation.

The chamber 100 further comprises a sputtering target 140 comprising a sputtering surface 142 facing the substrate 104, which comprises the material to be sputtered onto the substrate 104. The target 140 is electrically isolated from the chamber 100 by an isolator 144 which is typically made from a dielectric or insulator material. The target 140 is connected to a target power supply 148 which applies a bias voltage to the target 140 relative to a shield 150 which is in front of the walls of the chamber components, and/or the support 130 which is electrically floated. The target 140, shield 150, support 130, and other chamber components connected to the target power supply 148 operate as a gas energizer 152 to form a plasma of the sputtering gas. The gas energizer 152 can also include a source coil 153 which is used to generate a plasma in the chamber 100 by application of a current through the coil. The generated plasma energetically impinges upon and bombards the sputtering surface 142 of the target 140 to sputter material off the surface 142 onto the substrate 104.

The sputtering gas is introduced into the chamber 100 through a gas delivery system 160 provides gas from a gas supply 162 via conduits 164 having gas flow control valves 166, such as a mass flow controllers, to pass a set flow rate of the gas therethrough. The gases are fed to a mixing manifold (also not shown) in which the gases are mixed to from a desired process gas composition and fed to a gas distributor 168 having gas outlets in the chamber 100. The process gas may comprise a non-reactive gas, such as argon or xenon, which is capable of energetically impinging upon and sputtering material from a target. The process gas may also comprise a reactive gas, such as one or more of an oxygen-containing gas and a nitrogen-containing gas, that are capable of reacting with the sputtered material to form a layer on the substrate 104. Spent process gas and byproducts are exhausted from the chamber 100 through an exhaust 170 which includes exhaust ports 172 that receive spent process gas and pass the spent gas to an exhaust conduit 174 having a throttle valve 176 to control the pressure of the gas in the chamber 100. The exhaust conduit 174 is connected to one or more exhaust pumps 178. Typically, the pressure of the sputtering gas in the chamber 100 is set to sub-atmospheric levels, such as a vacuum environment, for example, gas pressures of 1 mTorr to 400 mTorr.

The chamber 100 is controlled by a controller 180 that comprises program code having instruction sets to operate components of the chamber 100 to process substrates 104 in the chamber 100. For example, the controller 180 can comprise program code that includes a substrate positioning instruction set to operate the substrate support 130 and substrate transport; a gas flow control instruction set to operate gas flow control valves to set a flow of sputtering gas to the chamber 100; a gas pressure control instruction set to operate the exhaust throttle valve to maintain a pressure in the chamber 100; a gas energizer control instruction set to operate the gas energizer to set a gas energizing power level; a temperature control instruction set to control a temperature control system to set temperatures of various components in the chamber 100; and a process monitoring instruction set to monitor the process in the chamber 100.

The chamber comprises a process kit 200 comprising various components that can be easily removed from the chamber 100, for example, to clean sputtering deposits off the component surfaces, replace or repair eroded components, or to adapt the chamber for other processes. In one version, the process kit 200 comprises a ring assembly 202 for placement about a peripheral wall 204 of the substrate support 130 that terminates before an overhanging edge 206 of the substrate. The ring assembly 202 comprises a deposition ring 208 and a cover ring 212 that cooperate with one another to reduce formation of sputter deposits on the peripheral walls 204 of the support 130 or the overhanging edge 206 of the substrate 104.

Figure 2:
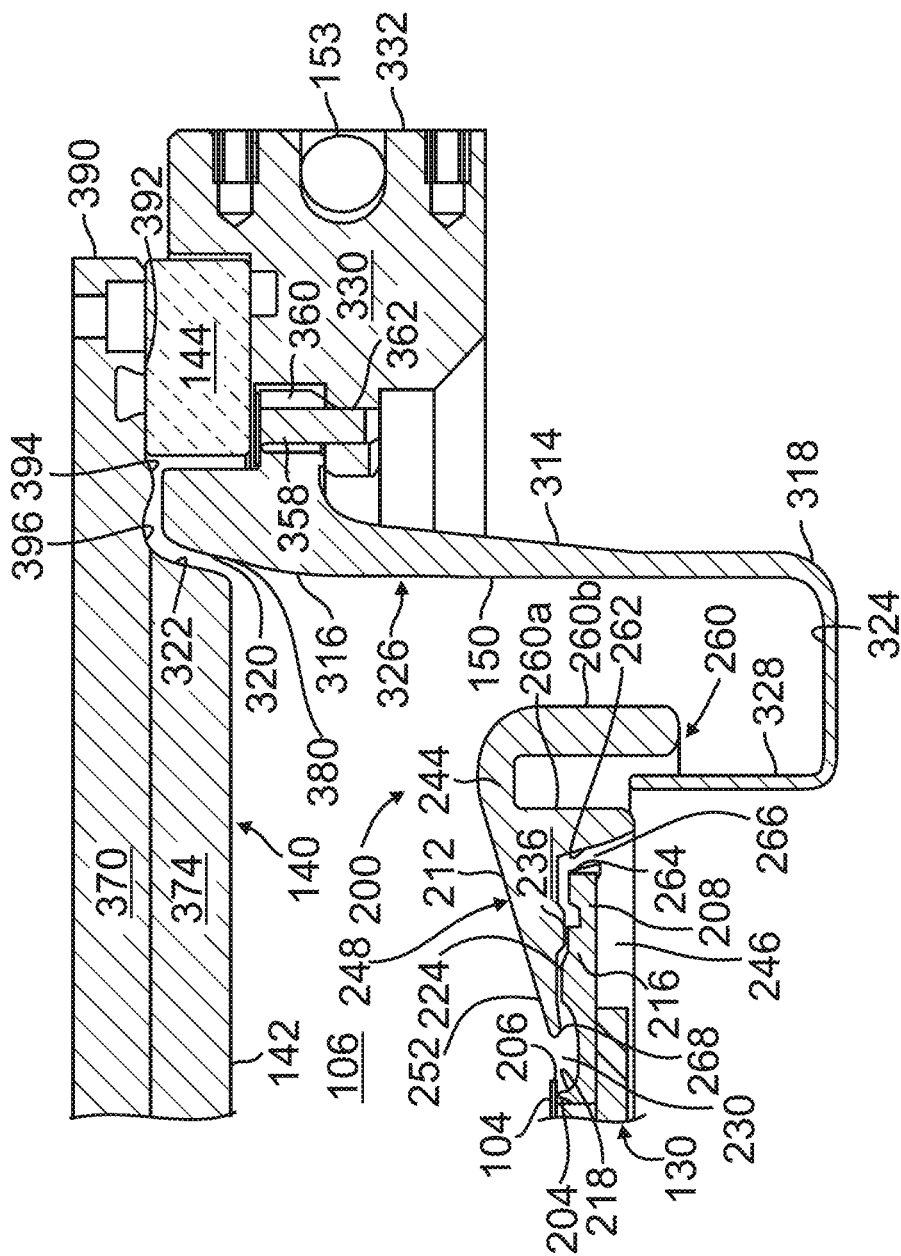
FIG. 2 is a sectional side view of the process kit shown in FIG. 1.
Figure 3:
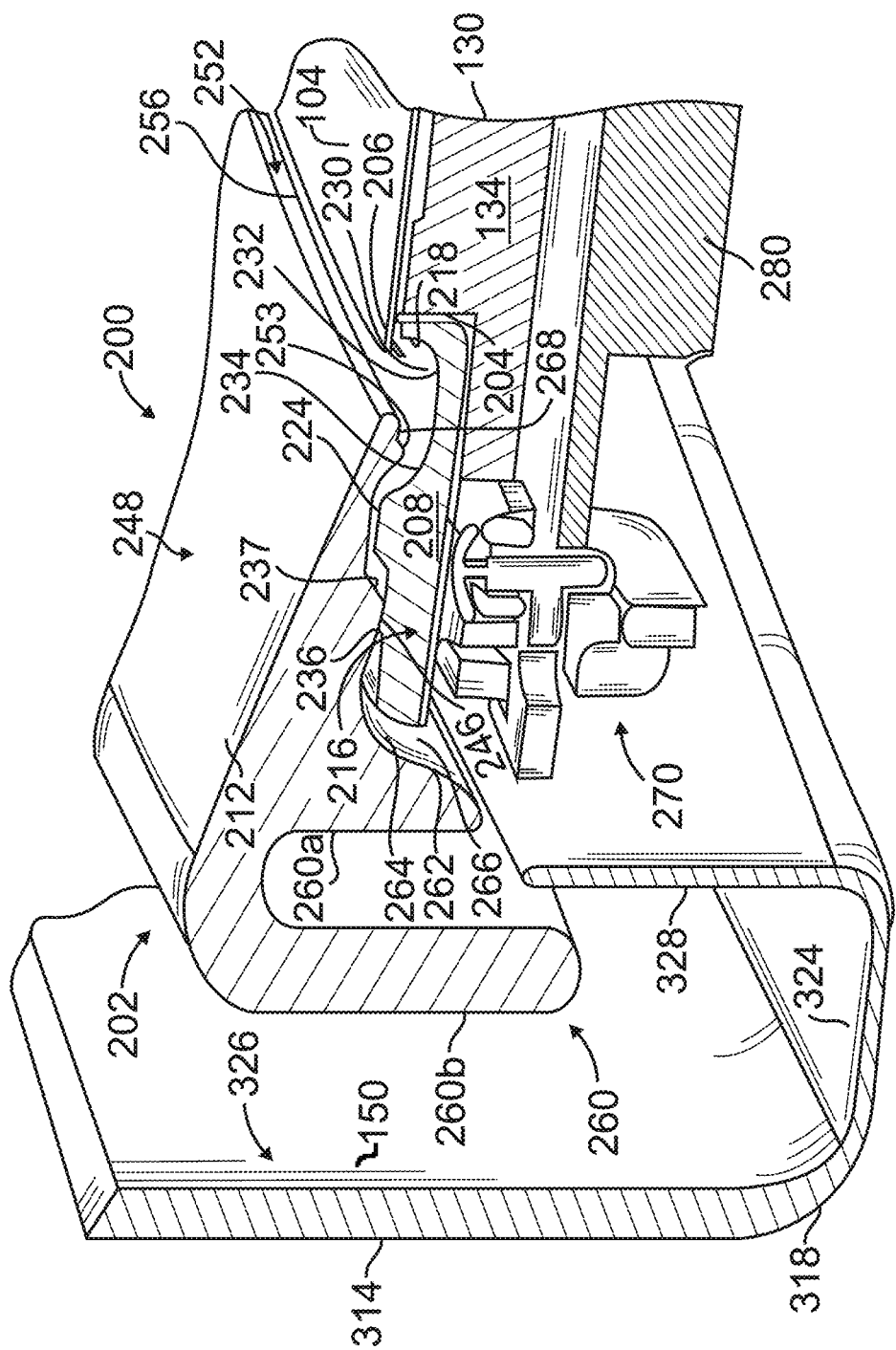
FIG. 3 is a perspective view of the process kit of FIG. 2.
Figure 4:
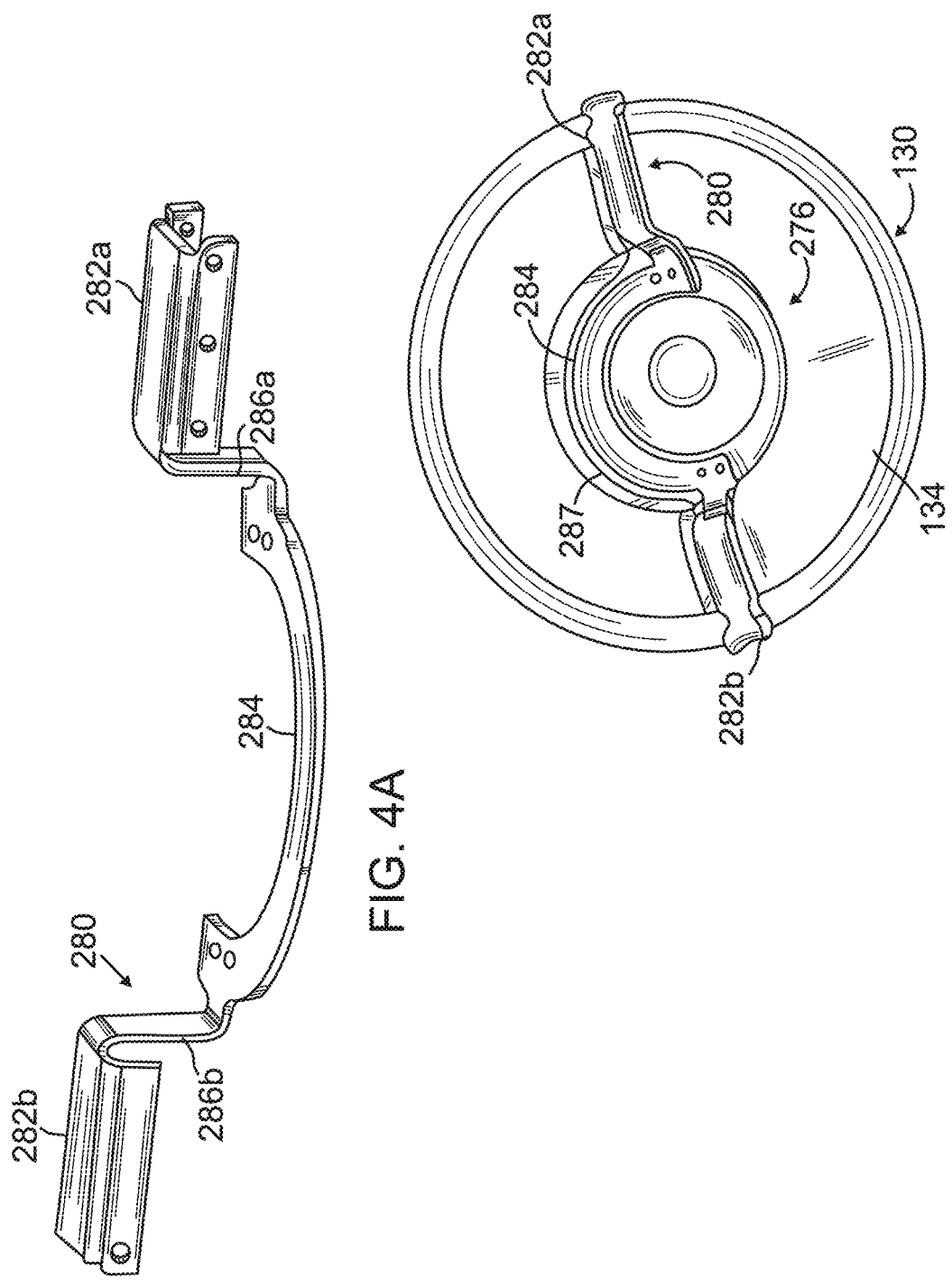
FIG. 4A is a perspective view of the retaining bracket for the anti-lift bracket.
FIG. 4B is a perspective view of the backside of the support showing the positioned retaining bracket for the anti-lift bracket.

The deposition ring 208 comprises an annular band 216 that extends about and surrounds the peripheral wall 204 of the support 130 as shown in FIGS. 2 and 3. The annular band 216 comprises an inner lip 218 which extends transversely from the band and is substantially parallel to the peripheral wall 204 of the support 130. The inner lip 218 terminates immediately below the overhanging edge 206 of the substrate 104. The inner lip 218 defines an inner perimeter of the deposition ring 208 which surrounds the periphery of the substrate 104 and support 130 to protect regions of the support 130 that are not covered by the substrate 104 during processing. For example, the inner lip 218 surrounds and at least partially covers the peripheral wall 204 of the support 130 that would otherwise be exposed to the processing environment to reduce or even entirely preclude deposition of sputtering deposits on the peripheral wall 204. Advantageously, the deposition ring 208 can be easily removed to clean sputtering deposits from the exposed surfaces of the ring so that the support 130 does not have to be dismantled to be cleaned. The deposition ring 208 can also serve to protect the exposed side surfaces of the support 130 to reduce their erosion by the energized plasma species. The deposition ring 208 is typically made from a metal, such as stainless steel or aluminum, or can be made from a ceramic material, such as aluminum oxide.

In the version shown in FIGS. 2 and 3, the annular band 216 of the deposition ring 208 has a raised ridge 224 that extends along the central portion of the band 216. The raised ridge 224 has a flat top surface 228 which is spaced apart from the cover ring 212 to form a convoluted gap 229 therebetween which acts an a labyrinth to reduce penetration of plasma species into the convoluted gap. An open inner channel 230 lies between the inner lip 218 and the raised ridge 224. The open inner channel 230 extends radially inward to terminate at least partially below the overhanging edge 206 of the substrate 104. The inner channel 230 has a first rounded corner 232 joining to the inner lip 218 and a gently sloped surface 234 joining to the raised ridge 224. The smooth corner 232 and sloped surface 234 facilitate the removal of sputtering deposits from these portions during cleaning of the deposition ring 208. The deposition ring 208 also has a ledge 236 which is located radially outward of the raised ridge 224 and serves to support the cover ring 212. In addition, a U-shaped channel 237 is provided between the raised ridge 224 and the ledge 236 to form a convoluted passageway therebetween which further prevents the flow the passage of plasma or gaseous species though the passageway thereby reducing the deposition of process deposits in the regions radially outward of the passageway. Thus the contour and profile of the deposition ring is shaped to reduce passage of process deposits through these regions. Unlike prior art designs, pins are not needed in the deposition ring 208 to retain the substrate 104 in the event that the substrate 104 slides or is misplaced in the chamber 100, due to accurate positioning of the substrate in the chamber during its transportation into the chamber.

The cover ring 212 of the ring assembly 202 encircles and at least partially covers the deposition ring 208 to receive, and thus, shadow the deposition ring 208 from the bulk of the sputtering deposits. The cover ring 212 is fabricated from a material that can resist erosion by the sputtering plasma, for example, a metallic material such as stainless steel, titanium or aluminum, or a ceramic material, such as aluminum oxide. In one version, the cover ring 212 is fabricated from titanium. The cover ring 212 comprises an annular wedge 244 which has a footing 246 which rests on the ledge 236 of the deposition ring 208 to support the cover ring 212. The footing 246 extends downwardly from the wedge 244 to press against the deposition ring 208 substantially without cracking or fracturing the ring 208.

The annular wedge 244 of the cover ring 212 has an inclined surface 248 that serves as a boundary to contain the sputtering plasma within the process zone between the target and the support 130. The inclined surface 248 provides a smooth and continuous surface on which sputtering deposits can deposit and be easily removed. In one version, the inclined surface 248 is inclined at an angle relative to an axis which is perpendicular to the flat plane formed by the processing surface of the substrate 104. In one version, the angle is at least about 60°, and can be even from about 65 to about 85°, or even about 80°. The angle of the inclined surface of the cover ring 212 is designed to minimize the buildup of sputter deposits nearest to the overhanging edge 206 of the substrate 104, which would otherwise negatively impact the deposition uniformity obtained across the substrate 104.

The wedge 244 tapers to the projecting brim 252 which overlies the inner channel 230 of the deposition ring 208. The projecting brim 252 terminates in a rounded edge 256 and has a planar bottom surface 268. The projecting brim 252 reduces deposition of sputtering deposits on the open inner channel of the deposition ring 208. Advantageously, the projecting brim 252 projects a distance corresponding to at least about half the width of the open inner channel of the deposition ring 208. For example, if the inner channel 230 has a width of at least about 12 mm, the projecting brim 252 has a width of at least about 6 mm. The projecting brim 252 projects over the open inner channel 230 of the deposition ring 208 to reach closer to the peripheral edge 206 of the substrate cover a portion of the open inner channel 230 of the deposition ring 208. In addition, the projecting brim 252 has a raised ridge 253 which extends downwardly and has an external shape with a profile which matches and follows the contour of the surface 234 of the underlying deposition ring 208. This shaped and closely matching contoured features inhibit the deposition of sputtering deposits on the peripheral overhang edge 206 of the substrate and also reduces deposits on the peripheral walls 204 of the support 130. They also force deposition to occur in the surface of the channel 230 by inhibiting the flow of gaseous plasma species and sputtered deposits over the peripheral edge 204. Thus, the contour of the raised ridge of the projecting brim 252 is sized, shaped, and positioned to cooperate with and complement the open inner channel 230 of the deposition ring 208 to form a convoluted and constricted flow path between the cover ring 212 and deposition ring 208 to inhibit the flow of process deposits onto the peripheral edge 204. The constricted flow path also restricts the build-up of low-energy sputter deposits on the mating surfaces of the deposition ring 208 and cover ring 212, which would otherwise cause them to stick to one another or to the peripheral overhang edge 206 of the substrate 104. The open inner channel 230 of the deposition ring 208 which extends underneath the substrate overhang edge 206 is designed in conjunction with shadowing from the projecting brim 252 of the cover ring 208 to collect, for example, a minimum of 3900 µm of aluminum sputter deposits in an aluminum sputtering chamber 100, while reducing or even substantially precluding sputter deposition on the mating surfaces of the two rings 208, 212.

The cover ring 212 also has a pair of cylindrical walls 260 that extend downwardly from the annular wedge 244. The cylindrical walls 260 are located radially outward of the footing 246 of the wedge 244. The cylindrical walls 260 comprise an inner wall 260a and the outer wall 260b, the inner wall 260a having a smaller height than the outer wall 260b. The radially internal surface 262 of the inner wall 260a is sloped to match a slope angle of the radially outer surface 264 of the deposition ring 208 to form yet another convoluted pathway 266 which impedes travel of plasma species and glow discharges to the surrounding area. Typically, the height of the outer wall 260a is at least about 1.2 times the height of the inner wall 260b. For example, for a cover ring 212 having an inner radius of about 154 mm, the height of the outer wall 160a is from about 25 mm, and the height of the inner wall 260b is from about 19 mm.

In another version, the process kit 200 also includes an anti-lift bracket 270 is used to retain the deposition ring 208 about the periphery of the substrate support 130 in the chamber 100, as shown in FIGS. 3-6. The anti-lift bracket 270 cooperates with additional structural features of the deposition ring 208 and support 130. For example, the deposition ring 208 comprises two peripheral recessed pockets 274 with holding posts 278 extending out from the pockets 274 to receive a pair of anti-lift brackets 270 on either side, one side being shown in FIG. 5. The pairs of pockets are located diametrically opposing one another across the support 130. In this version, a restraint beam 280 is also mounted on a backside surface 276 of the support 130 to hold onto the anti-lift bracket 270, as shown in FIGS. 4A and 4B. The restraint beam 280 comprises two opposing flat prongs 282a,b which extend radially outward of a circular ring 284 in the backside surface 276 of the support 130. The two opposing flat prongs 282a,b are mounted on the vertical arms 286a,b which are joined to the circular ring 284. The circular ring 284 is shaped and sized to fit into a recess 287 in the backside of the support 130.

Figure 5:
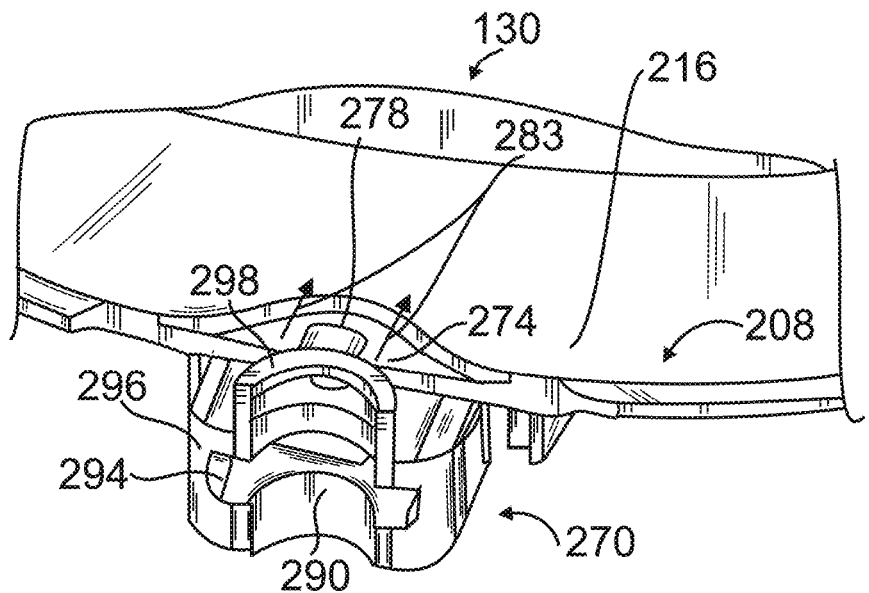
FIG. 5 is a perspective view of the anti-lift bracket sliding onto the holding post in a recessed pocket on a deposition ring which surrounds the substrate support.
Figure 6:
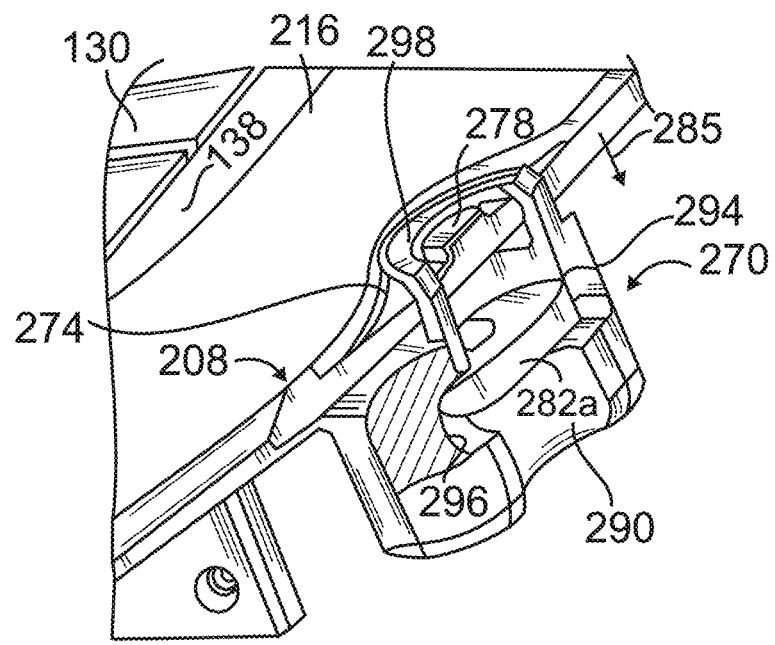
FIG. 6 is a perspective view of the anti-lift bracket after it is fitted onto the holding post of the deposition ring which is around the substrate support.

The anti-lift bracket 270 comprises a block 290 comprising a through-channel 294 which receives a prong end 282a of the restraint beam 280 as shown in FIGS. 5 and 6. The through-channel 294 comprises an oval shaped slot 296 sized larger than the prong 282a of the restraint beam 280. A retaining hoop 298 attached to the block 290 is sized to slide over a holding post 278 in a recessed pocket 274 of the deposition ring 208. During assembly, the anti-lift bracket 270 is brought alongside the outer periphery of the deposition ring 208 and the slot 296 of the through-channel 294 is slid onto a prong 282 of the restraint beam 280 as shown by the arrows 283 so that the access hole 299 of the retaining hoop 298 is directly above the holding post 278 as shown in FIG. 5. The anti-lift bracket 274 is then lowered, as shown by the arrow 285, so that the retaining hoop 298 drops down and encircles the holding post 278 allowing the weight of the block 290 of the bracket 270 to stably hold down the deposition ring 208 as shown in FIG. 6. The anti-lift bracket 270 only engages the restraint beam 280 when the deposition ring 208 is pulled upwards, for example, when the deposition ring becomes stuck to the substrate 104. This design minimizes the thermal and mechanical strain on the ceramic deposition ring 208 and cover ring 212 in normal use.

Figure 7:
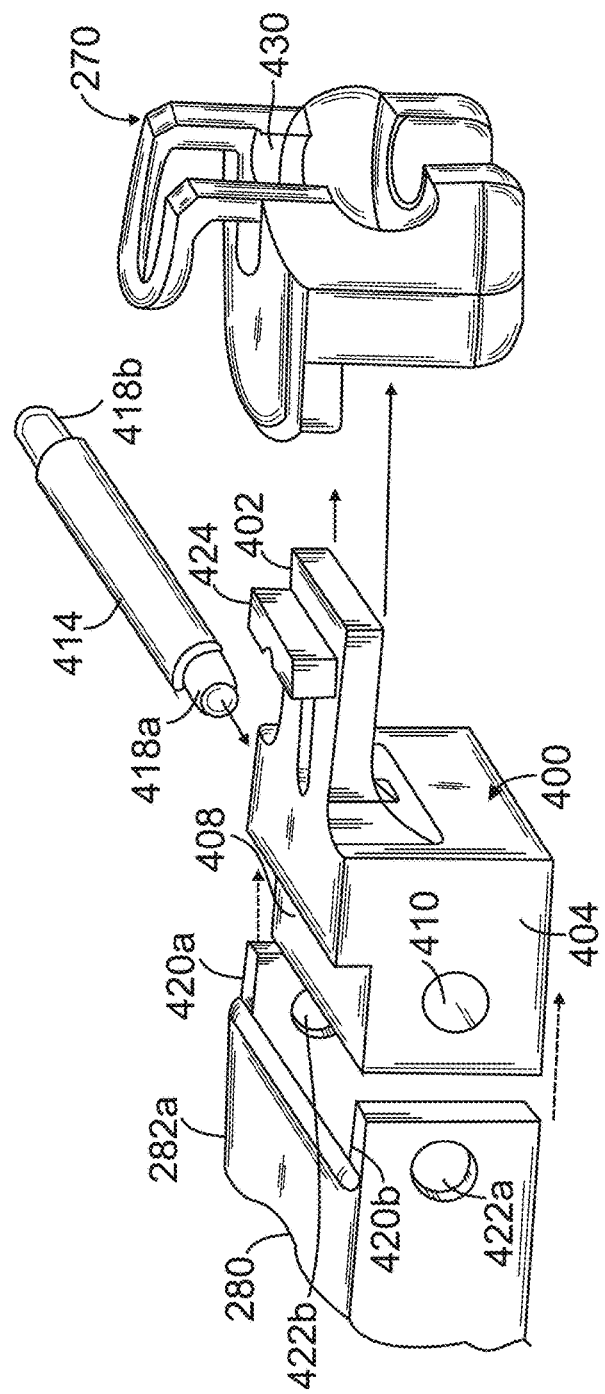
FIG. 7 is an exploded perspective view of the anti-lift bracket sliding onto a ceramic isolator which couples to a prong of the restraint beam with a pin holding the assembly together.
Figure 8:
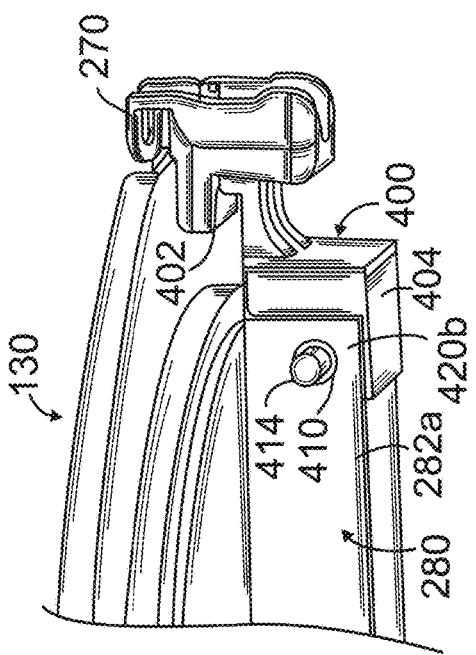
FIG. 8 is a perspective view of the anti-lift bracket, ceramic isolator, pin, and restraint beam, as assembled onto a substrate support.

Another version of an assembly comprising the anti-lift bracket 270 which is used to retain the deposition ring 208 about the periphery of the substrate support 130 in the chamber 100, is shown in FIGS. 7 and 8. In this version, the anti-lift bracket 270 is attached to a ceramic isolator 400 which then couples to a flat prongs 282a,b of the restraint beam 280. The anti-lift bracket 270 slides onto a ledge 402 which extends out of a block 404 of the ceramic isolator 400. The ceramic isolator 400 serves to electrically isolate the restraint beam 280 from the other components by providing an insulating member in the electrical pathway between the support 130 and the deposition ring 208. When the deposition ring 208 is made from a metal, interrupting the electrical pathway, serves to reduce electrical interference between these two structures. The block 404 of the ceramic isolator 400 also has a recessed surface 408 for resting the restraint beam 280. A through-hole 410 in the block 404 is provided for the pin 414 to connect the ceramic isolator 400 to the matching holes 422a,b in the facing and parallel extensions 420a,b of the prong 282a of the restraint beam 280. The pin 414 has two reduced diameter posts 418a,b which are passed through the through hole and a flat edge which rests against the surface of the parallel extensions 420a,b of the prong 282a. The pin 414 can be made from a metal, such as stainless steel. The ledge 402 of the ceramic isolator extends radially outward from the block 404 and has a protrusion 424 which acts as a stop against a receiving surface 430 of the anti-lift bracket 270. The ceramic isolator 400 is typically machine from a ceramic, such as aluminum oxide. It should be noted that while one ceramic structure is described, other ceramic structures blocks can also be placed in the pathway between the restraint beam 280 and the anti-lift bracket 270 to further isolate the structures, such as a ceramic block (not shown) placed between the beam 280 and the substrate support 130 at their interface.

The process kit 200 also includes a unitary cylindrical shield 150 that encircles the sputtering surface 142 of a sputtering target 140 that faces the substrate support 130, and the outer periphery of the substrate support 130, and shadows the sidewalls 116 of the chamber 100. The shield 150 serves to reduce deposition of sputtering deposits originating from the sputtering surface 142 of the sputtering target 140 onto the surfaces of support 130, and the sidewalls 116 and bottom wall 120 of the chamber 100. The shield 150 comprises a cylindrical outer band 314 having a diameter sized to encircle the sputtering surface 142 of the sputtering target 140 and the substrate support 130. The outer band 314 has an upper end 316 and a bottom end 318. The upper end 316 tapering in thickness in the direction of the bottom end 318, and having a radially outwardly tapered surface 320 adjacent to a sloped peripheral surface 322 of the sputtering target 140. The shield 150 further comprises a base plate 324 extending radially inward from the bottom end 318 of the outer band 314 to join a cylindrical inner band 328 that at least partially surrounds the peripheral edge 204 of the substrate support 130. The inner band 328 comprises a height that is smaller than the outer band 314, for example, the inner band 328 has a height which is 0.8 times smaller than the height of the outer band 314. The gaps between the inner and outer bands 328, 314, respectively, and the outer wall 260b and inner wall 260a of the cover ring 212 again serve to hinder and impede ingress of plasma species into this region.

The outer band 314, base plate 324 and inner band 328 of the unitary shield 150 comprise a unitary monolith structure that is a single piece. For example, the entire shield 150 can be made from 300 series stainless steel. This is advantageous over prior shields which included multiple components, often two or three separate pieces to make up the complete shield, which made it more difficult and laborious to remove the shield for cleaning. Also, the single piece shield 150 has a continuous surface 326 exposed to the sputtering deposits without interfaces or corners that are more difficult to clean out. Also, the single piece shield 150 is more thermally uniform than multiple shields, both for heating during periodic maintenance as well as cooling during processes in which a plasma is heating the shield. The single piece shield 150 has only one thermal interface to the heat exchanger 330. The single piece shield 150 also shields the chamber walls 108 from sputter deposition during process cycles. The shield 150 also creates a contoured gap in the region of the target 140 referred to as the "darkspace" to help shape the plasma while preventing arcing between target 140 and chamber 100.

Figure 9:
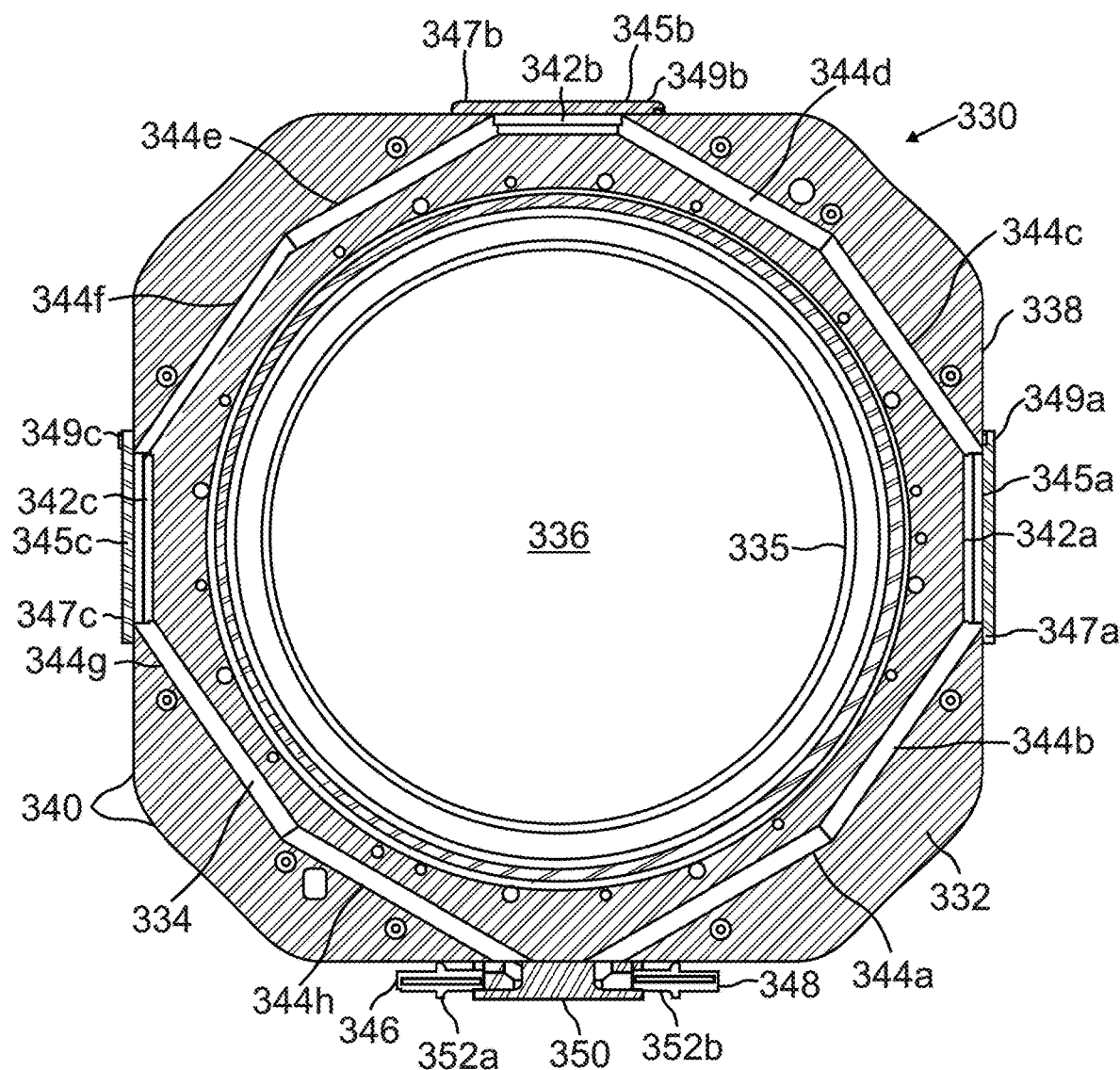
FIG. 9 is a top sectional view of a heat exchanger showing the polygonal conduit therein.

A heat exchanger 330 was used to cool the shield 150 to reduce the thermal expansion stresses. Portions of the shield 150 can become excessively heated by exposure to the plasma formed in the substrate processing chamber. Excessive heating of the shield 150 results in its thermal expansion which causes sputtering deposits formed on the shield 150 to flake off from the shield to fall upon and contaminate the substrate 104. The heat exchanger 330 comprises a plate 332 made of metal, such as stainless steel. The plate 332 has an inner perimeter 335 comprising a circular aperture 336 sized to fit around the cylindrical shield 150, and an outer perimeter 338 comprising a polygon with a plurality of sides 340, as shown in FIG. 9.

The heat exchanger 330 has a polygon conduit 334 to flow heat exchange fluid from a fluid source (not shown) therethrough to cool the plate 332. The polygon conduit 334 comprises a plurality of legs 344a-h interconnected in a polygonal pattern around the circular aperture 336. The legs 344a-h are each drilled at an acute angle starting from a side 340 of the outer perimeter of the plate 332, the acute angles being from about 20 to about 45°. The conduit 334 also comprises channels 342a-c that are each covered by a cover plate 345a-c which has an oval O-ring 347a-c in a groove 349a-c in the plate 345a-c to seal the interface. The polygonal conduit 334 also has an inlet 346 and outlet 348 to receive and pass out the heat exchange fluid. The inlet and outlet 346, 348 comprise channels 352a,b that feed into a manifold 350.

The heat exchange fluid is flowed through the polygonal conduit 334 to exchange heat with the shield 150 and control its temperature. A suitable heat exchange fluid may be, for example, water. Controlling the temperature of the shield 150 reduces expansion of the shield in the plasma environment limiting the flaking of the sputtering deposits from the shield. Fastening the shield 150 to the heat exchanger 330 provides better heat transfer between the shield 150 and the heat exchanger plate 332. The shield 150 is fastened to the heat exchanger by a fastener 358, and in this version, the shield comprises a ledge 360 having a substantially vertical opening 362 extending therethrough. The fastener 358 is shaped and sized to pass through the opening 362 in the ledge 360 to fasten the shield 150 to the heat exchanger 330. Advantageously, the heat exchanger 330 integrates the source coil 153 and target 140 to the chamber 100 while also holding the shield 150. Water-cooling also provides greater thermal stability of the single piece shield 150 during the process.

The sputtering target 140 comprises a backing plate 370, typically made from a high strength aluminum alloy, which supports a sputtering plate 374 comprising the sputtering surface 142. The backing plate 370 of the target 140 is separated and the electrically isolated from the chamber 100 by the isolator 144 which is typically a ring made from a ceramic material, such as aluminum oxide. The sputtering plate 374 is composed of a high purity sputtering material to be sputtered onto the substrate 104, such as for example, aluminum, tantalum, titanium, and other such metals, typically at a purity of 99.99% or higher. The sputtering plate 374 comprises a perimeter with a sloped edge 322 adjacent to, and matching the contour of, the sloped surface 320 of the shield 150, which defines a gap 380 having a uniform thickness therebetween which serves as another plasma retarding convoluted labyrinth.

In one version, the backplate of the target 140 comprises a peripheral ledge 390 which extends beyond the radius of the sputtering plate 374. The peripheral ledge 390 supports the target 140 by resting on the isolator 144 and can be fastened to the isolator 144 or the chamber sidewall 116. The peripheral ledge 390 extends beyond the sloped edge 322 of the sputtering plate 374 and comprises an outer footing section 392 which rests on the isolator 144 in the chamber 100. The peripheral ledge 390 comprises an inner bump 394 which is shaped and sized to reduce deposition of sputtering deposits on the isolator 144 and shield 150. The bump 394 in combination with an immediately abutting and preceding groove 396 reduces plasma formation and the deposition of sputtering process deposits on undesired areas of the chamber walls 108, isolator 144 and heat exchanger 330. The bump 394 and groove 396 are shaped, sized and positioned to inhibit the flow or migration of plasma and sputtered species through the gap between the target 140 and the isolator 144. In particular, the bump 394 impedes the penetration of low-angle sputtered deposits into the gap between the target and the isolator. The bump 394 comprises a curved cross-section with a height of from about 1.5 to about 2 mm.

The various components of the process kit 200 and the target 140 significantly increase the number of process cycles and process on-time that the process kit can be used in the chamber without removing the process kit for cleaning. This is accomplished by reducing the amount of sputtering deposits formed on the components around the substrate which are difficult to clean. The components of the process kit 200 and target 140 are designed to allow increased power and pressure in the sputtering zone 106 to yield higher deposition throughput by reducing the temperature in the darkspace region which is near the upper end 316 of the shield 150 and near the target 140. It also improves the thermal uniformity of the shield 150 using the heat exchanger 330. In addition, the process kit 200 is designed to allow at least 85% more aluminum to be deposited in the chamber 100 before the kit 200 has to be changed to perform a maintenance cycle. This is a significant improvement in the uptime of the chamber and also increases process throughput.

Figure 10:
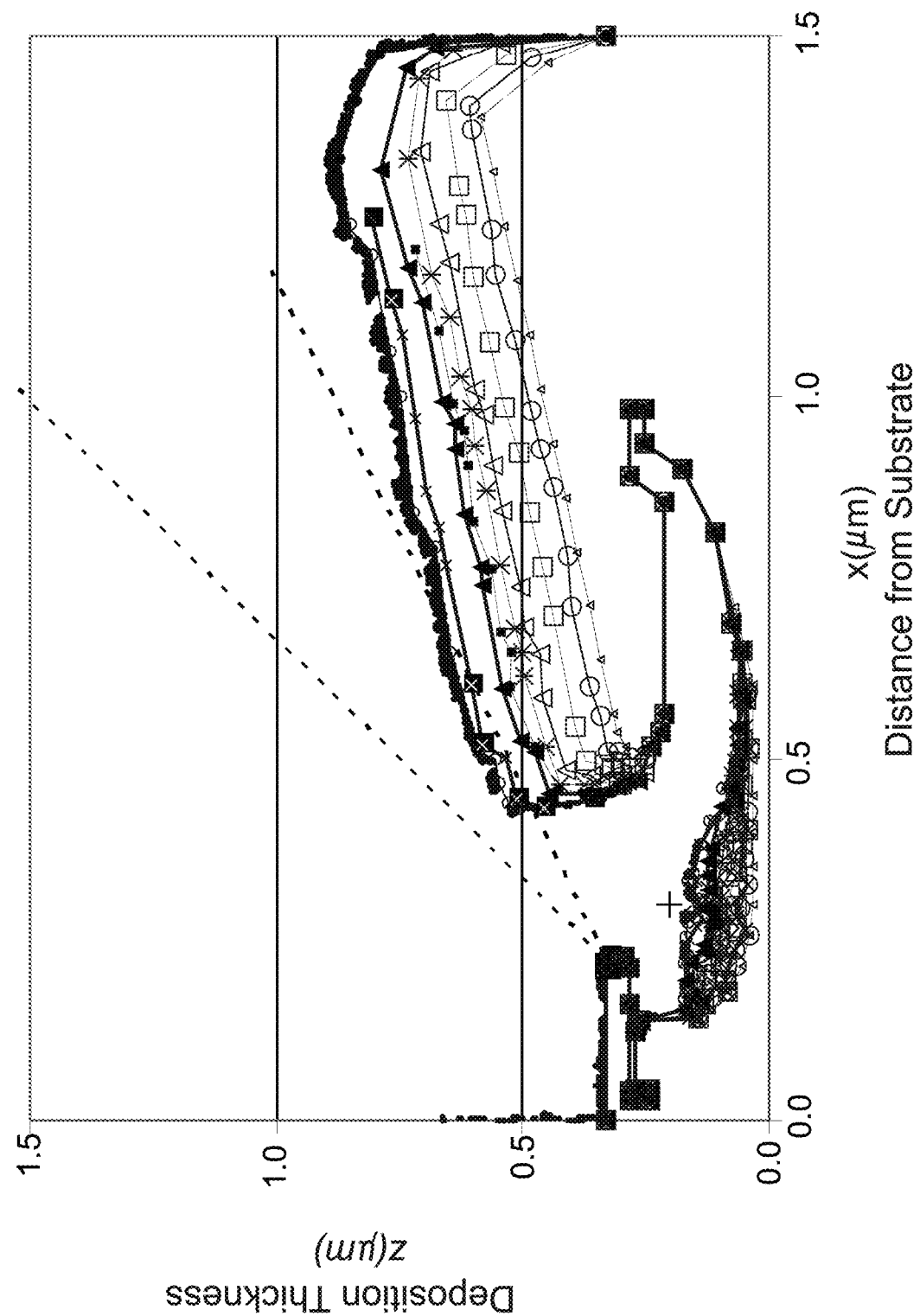
FIG. 10 is a graph of modeling results obtained for a scaled geometry of the process kit showing the thickness of deposits formed on the components as a function of distance from the substrate and support.

FIG. 10 is a graph of modeling results obtained for a scaled geometry of the process kit in aluminum sputter deposition showing the thickness of deposits formed on the deposition ring 208 and cover ring 212 as a function of distance from the substrate 104 and support 130. The modeling program was PVD Pro™ program and it uses parameters for the type of metal being deposited as well as the geometry of the target and other chamber components. The model allowed the comparison of several different configurations for the features of, and position of the cover ring 212 and deposition ring 208. This allowed optimization for minimum buildup of aluminum deposits on the surfaces of the groove 230 in the deposition ring 208, as well as in the line of sight of the edge 252 of the cover ring 212. The modeling accuracy was determined with a test run of prototype hardware, and also by modeling geometry of known performance, to obtain the designs presented herein. It is seen that changing the shape and design configurations of the chamber components and the spaces and gaps therebetween, significantly changed the thickness of deposition material on the surfaces of the components. Further, the rate of increase in the amount of deposition on the deposition ring remained at about the same for increasing distance from the substrate center as shown by the same angle of the linear sections of the graph between 0.5 and 1.5 on the x-axis. There is a vertical change in the net amount of deposition for different configurations, but the shape of the curve remains essentially the same.

The present invention has been described with reference to certain preferred versions thereof; however, other versions are possible. For example, the process kit 200 and ring assembly 202 can be used in other types of applications, as would be apparent to one of ordinary skill, for example, etching, CVD and etching chambers. Other shapes and configurations of the deposition ring 208, cover ring 212, shield 150 and anti-lift bracket 270 can also be used. Therefore, the spirit and scope of the appended claims should not be limited to the description of the preferred versions contained herein.

What is claimed is:

1. A shield assembly encircling a sputtering target that faces a substrate support in a substrate processing chamber, the shield assembly comprising:
   (i) a shield comprising:
      (a) an outer band having a diameter sized to encircle the sputtering target, the outer band having upper and bottom ends, the upper end tapering in thickness in the direction of the bottom end, and the upper end having a tapered surface extending radially outwardly and adjacent to the sputtering target;
      (b) a base plate extending radially inward from the bottom end of the outer band;
      (c) an inner band joined to the base plate and at least partially surrounding a peripheral edge of the substrate support; and
      (d) a ledge having a first opening; and
   (ii) a heat exchanger having a plate having (i) an inner perimeter comprising a circular aperture sized to fit around the shield, (ii) an outer perimeter comprising a plurality of sides, (iii) a conduit therein with an inlet and outlet to flow heat exchange fluid therethrough, and (iv) a second opening aligned with the first opening of the ledge of the shield, to allow a fastener to pass through the first and second openings to fasten the shield to the heat exchanger.

2. A shield assembly according to claim 1 wherein the outer and inner bands are cylindrical.

3. A shield assembly according to claim 1 wherein the outer band, base plate and inner band comprise a unitary monolith.

4. A shield assembly according to claim 3 wherein the unitary monolith has a continuous surface without interfaces.

5. A shield assembly according to claim 1 wherein the sputtering target has a sloped peripheral surface, and the radially outwardly extending tapered surface of the upper end of the outer band is adjacent to the sloped peripheral surface to form a contoured gap therebetween.

6. A shield assembly according to claim 1 wherein the height of the inner band is smaller than the height of the outer band.

7. A shield assembly according to claim 6 wherein the height of the inner band is 0.8 times smaller than the height of the outer band.

8. A shield assembly according to claim 1 comprising a gap between the inner and outer bands that is capable of hindering ingress of plasma species into this region.

9. A shield assembly according to claim 1 wherein the heat exchanger conduit is a polygon conduit having a plurality of legs interconnected in a polygonal pattern.

10. A shield assembly according to claim 9 wherein the heat exchanger plate comprises an outer perimeter that is a polygon.

11. A shield assembly according to claim 1 further comprising the fastener shaped and sized to pass through the first and second openings to fasten the shield to the heat exchanger.

12. A shield assembly according to claim 1 wherein the heat exchanger comprises an integrated source coil capable of generating a plasma in the chamber.

13. A heat exchanger that integrates a source coil and cools an upper end of a shield that encircles a sputtering surface of a sputtering target that faces a substrate support in a substrate processing chamber, the heat exchanger comprising:
   (a) a plate comprising an inner perimeter that is a circular aperture shaped and sized to fit around the shield, an outer perimeter that is a polygon with a plurality of sides, and a fastener to fasten the shield to the heat exchanger; and
   (b) a polygon conduit to flow heat exchange fluid in the plate, the polygon conduit comprising (i) a plurality of legs that are interconnected in a polygonal pattern around the aperture, (ii) a plurality of channels that are each covered by a cover plate, and (iii) an inlet and outlet to flow the heat exchange fluid therethrough.

14. A heat exchanger according to claim 13 wherein each leg of the conduit extends at an angle of from about 20 to about 45° from a side of the outer perimeter.

15. A heat exchanger according to claim 13 further comprising the integrated source coil that is capable of generating a plasma in the chamber.

16. A shield assembly encircling a sputtering target that faces a substrate support in a substrate processing chamber, the shield assembly comprising:
   (a) a shield comprising:
      (i) an outer band having a diameter sized to encircle the sputtering target, the outer band having upper and bottom ends, the upper end tapering in thickness in the direction of the bottom end, and the upper end having a tapered surface extending radially outwardly and adjacent to the sputtering target;
      (ii) a base plate extending radially inward from the bottom end of the outer band;
      (iii) an inner band joined to the base plate and at least partially surrounding a peripheral edge of the substrate support; and
      (iv) a ledge having an opening adapted to allow a fastener to pass therethrough to fasten the shield to the heat exchanger;

(b) a heat exchanger having a plate with an inner perimeter comprising a circular aperture sized to fit around the shield, the plate comprising a conduit therein with an inlet and outlet to flow heat exchange fluid therethrough; and
(c) a fastener shaped and sized to pass through the opening in the ledge of the shield to fasten the shield to the heat exchanger.

17. A shield assembly according to claim 16 comprising at least one of the following:
    (a) the outer and inner bands are cylindrical;
    (b) the outer band, base plate and inner band comprise a unitary monolith;
    (c) the height of the inner band is smaller than the height of the outer band;
    (d) the height of the inner band is 0.8 times smaller than the height of the outer band; and
    (e) comprising a gap between the inner and outer bands.

18. A shield assembly according to claim 16 wherein the sputtering target has a sloped peripheral surface, and the radially outwardly extending tapered surface of the upper end of the outer band is adjacent to the sloped peripheral surface to form a contoured gap therebetween.

19. A shield assembly according to claim 16 wherein the heat exchanger comprises at least one of the following:
    (a) the conduit is a polygon conduit having a plurality of legs interconnected in a polygonal pattern;
    (b) the plate comprises an outer perimeter that is a polygon; and
    (c) an integrated source coil capable of generating a plasma in the chamber.

20. A shield assembly according to claim 16 wherein the conduit of the heat exchanger comprises (i) a plurality of legs that are interconnected in a polygonal pattern, and (ii) a plurality of channels that are each covered by a cover plate.

\* \* \* \* \*